United States Patent [19]

Matsumoto et al.

[11] 4,165,251
[45] Aug. 21, 1979

[54] STRIPPING AND DEVELOPING DEVICE

[75] Inventors: Nobuo Matsumoto; Osami Tsuji; Yukio Kamiya; Etsuo Shiozawa, all of Minami-ashigara, Japan

[73] Assignee: Fuji Photo Film Co., Ltd., Minami-ashigara, Japan

[21] Appl. No.: 853,956

[22] Filed: Nov. 22, 1977

[30] Foreign Application Priority Data

Nov. 22, 1976 [JP] Japan .............................. 51-140962
Dec. 17, 1976 [JP] Japan .............................. 51-151639

[51] Int. Cl.² ..................... B32B 31/00; G03B 17/50; G03D 9/02
[52] U.S. Cl. .................................. 156/584; 354/86; 354/304
[58] Field of Search .................. 156/584; 354/86, 304

[56] References Cited

U.S. PATENT DOCUMENTS

| 1,543,944 | 6/1925 | Mitchell | 156/584 |
| 3,452,712 | 7/1969 | Townsend | 156/584 |
| 3,951,727 | 4/1976 | Greenberg | 156/584 |

Primary Examiner—Douglas J. Drummond
Attorney, Agent, or Firm—Sughrue, Rothwell, Mion, Zinn and Macpeak

[57] ABSTRACT

A developing device for a photosensitive material consisting of a cover base laminated through the intermediary of a photosensitive layer to a support member develops the photosensitive material by stripping the cover base from the support member. The developing device employs a stripping roller consisting of the combination of a plurality of diametrically small separating rollers and a plurality of diametrically large brush rollers arranged in alternating side by side relation. A plurality of nip rollers contact respective ones of the separating rollers. The stripping roller is rotated in a direction opposite to the direction of movement of a photosensitive material and disposed in a photosensitive transporting passage with its brush rollers contacting the cover base surface. The cover base is stripped at its leading end from the support member by the brush rollers, and the leading end of the cover base is held for transportation between the separating rollers and the nip rollers.

5 Claims, 10 Drawing Figures

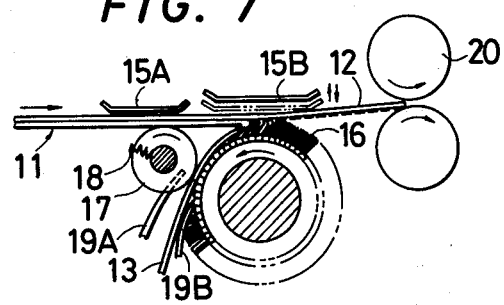
FIG. 7
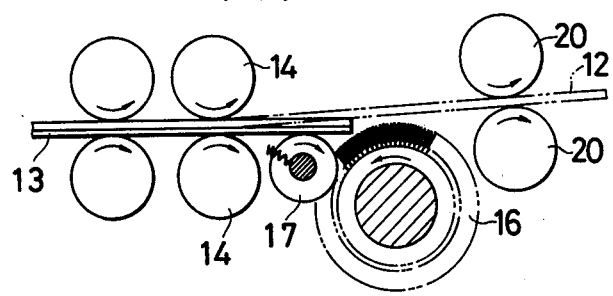
FIG. 8
FIG. 9
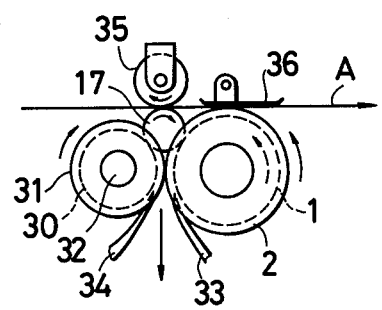
FIG. 10
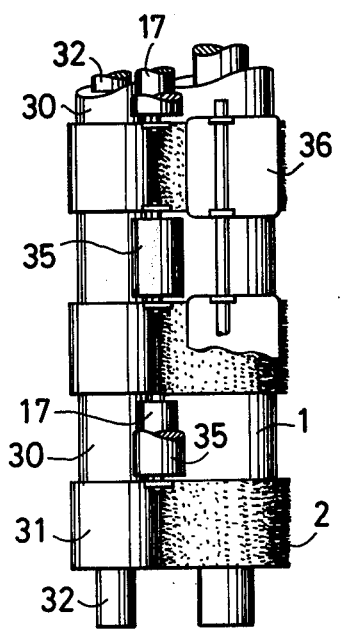

STRIPPING AND DEVELOPING DEVICE

BACKGROUND OF THE INVENTION

This invention relates to a developing device for a photosensitive material consisting of a cover base laminated through the intermediary of a photosensitive layer to a support member, wherein development of the photosensitive material is achieved by stripping the cover base from the support member.

With a photosensitive material consisting, for example, of a support member, such as an aluminum plate, a photosensitive layer containing a photo-hardening material, and a cover base having a photo-transmitting property, such as a polyethylene terephthalate film, and having characteristics in which an area of the photosensitive layer exposed to light is cured to be stuck to the support member and an area unexposed thereof is stuck to the cover base, an image on the photosensitive material is developed as a resist image on the support member by stripping the cover base.

One prior art developing device for such a photosensitive material has been such that development is achieved by sticking an adhesive tape to the surface of the cover base and taking up the adhesive tape to strip the cover base from the support member. Such a device, however, requires adhesive tape as well as an adhesive tape feed mechanism, resulting in increased manufacturing and running costs. Furthermore, such a device does not always function satisfactorily due to an insufficient adhesion of the adhesive tape to the cover base.

Another prior art developing device includes a roller provided with suction holes in the peripheral surface thereof, so that the cover base is stripped under suction from the support member for development. This type of developing device requires a vacuum pump and an air control mechanism, thus resulting in an increased size of the device itself, and hence an increased cost.

SUMMARY OF THE INVENTION

It is accordingly an object of the present invention to provide a developing device, wherein a cover base is positively stripped from a support member and the cover base thus separated is caused to be positively ejected, by a mechanism simple in construction, dispensing with extra materials such as adhesive tape.

To attain the object described, there is provided according to the present invention a device for developing a photosensitive material by stripping a cover base from the photosensitive material consisting of the cover base laminated through the intermediary of a photosensitive layer to a support member, the developing device being characterized by a stripping roller consisting of the combination of a plurality of diametrically small separating rollers and a plurality of diametrically large brush rollers, both of which are arranged alternately in side by side relation, and a plurality of nip rollers contacting respective separating rollers, the plurality of nip rollers being arranged separately from or in side by side relation to one another. The aforesaid stripping roller is rotated in a direction opposite to the direction of movement of a photosensitive material and disposed in a photosensitive material transporting passage, with its brush rollers contacting the cover base surface, so that the cover base is stripped at its leading end from the support member by the brush rollers, and the leading end of the cover base is held for transportation between the separating rollers and the nip rollers, whereby the cover base is separated from the support member completely. Back-up rollers rotate in contact with the aforesaid nip rollers, and guide rollers rotate in a direction of the outgoing cover base, in opposing relation to the brush rollers of the stripping roller, the back-up rollers and guide rollers being arranged alternately in side by side relation, respectively, and free to rotate independently of one another.

With the stripping and developing device according to the present invention, in order to arrange the back-up rollers and guide rollers in side by side relation, respectively, in a manner that the back-up rollers and guide rollers are free to rotate independently of one another, one of the following three ways of arrangement may be selected.

One arrangement is to mount the back-up rollers rigidly on a shaft, with the guide rollers being freely rotatable. The other is to mount the guide rollers fixedly on a shaft, with the back-up rollers being freely rotatable. Another is to mount the back-up rollers and the guide rollers rotatably on a shaft. Where the guide rollers are mounted fixedly on a shaft, it is only necessary to rotate the shaft, in order to positively rotate the guide rollers in a direction of the outgoing cover base. Where the guide rollers are rotatably mounted on a shaft, guide rollers having a larger diameter than the back-up rollers are used, and drive rollers in contact with the guide rollers are required to positively rotate the guide rollers. The guide rollers are not necessarily positively rotated, but may be rotated by the contact with the cover base which is led out by the separating rollers and nip rollers. In the latter case, the guide rollers are preferably journaled with ball bearings on a shaft, so as to rotate as freely as possible. Alternatively, the guide rollers may be disposed in contact with the stripping brush rollers, so that the guide rollers may be rotated by the rotation of the stripping brush rollers. Also in this case, rotation of the guide rollers is basically caused by the contact of the guide rollers with the cover base as in the former case.

From the viewpoint of permitting the uniform separation of cover base from the over-all surface of the support member, it is preferable that the back-up rollers are fixedly mounted on a shaft, and the guide rollers, in turn, are freely rotatable independently of one another in contacting relation to the stripping brush rollers.

BRIEF DESCRIPTION OF THE DRAWINGS

In the drawings:
FIG. 7 is a side view illustrating the mode of operation of the device according to the present invention;
FIG. 8 is a side view of a stripping device of another embodiment;
FIG. 9 is a side view of the essential part of the stripping-developing device according to the present invention;
and
FIG. 10 is a plan view of FIG. 9.

DETAILED DESCRIPTION OF THE INVENTION

Figure 1:
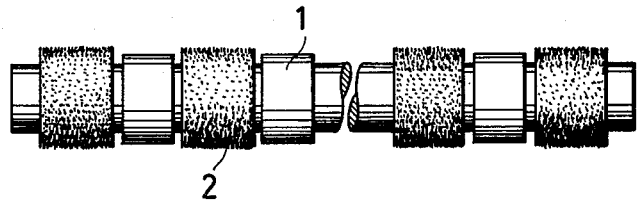
FIG. 1 is a front view of a stripping roller.
Figure 2:
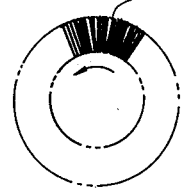
FIG. 2 is a cross sectional view in the axial direction of one of the brush rollers of FIG. 1.

A stripping roller, as best seen in FIG. 1, consists of the combination of separating rollers 1 and brush rollers 2, both of which are arranged alternately in side by side relation, the brush rollers being larger in diameter than the separating rollers. Separating rollers 1 are made of a material having a coefficient of friction such that there is no slip between the peripheral surface of the roller relative to the cover base surface, preferably a material having both the friction and resiliency of rubber or soft plastic or a material having a rough-surface, though lacking resiliency. Brush rollers 2 contacting the cover base need be comparatively high in stiffness. The length of a brush element may be long for a stiff, resilient material, and preferably short for a soft resilient material. With a view to facilitating the stripping of a cover base from a support member, the use of brush rollers with tip-bent brush material, as shown in FIG. 2, yields better results. The brush material, whether a natural material or an artificial material, may be in the form of a bundle of metal or plastic filaments, or in the form of a brush molded from the above materials.

Figure 3:
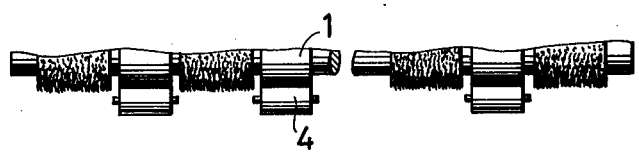
FIGS. 3 and 4 are plan view showing the condition of the separating rollers and nip rollers which are arranged in opposed relation, respectively.
Figure 4:
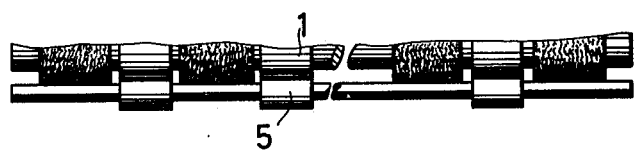

A nip roller may consist of a plurality of independent rollers 4, each of which is individually pressed in close contact against each separating roller 1 opposing thereto, as illustrated in FIG. 3. As an alternative, the nip roller may consist of an integral roll member 5 with diametrically large portions alternating with diametrically small portions, as illustrated in FIG. 4. In the latter case, the nip roller is disposed with each of the diametrically large portions 5 being pressed in close contact against each separating roller 1 opposing thereto. The material for the nip roller may be any of metal, plastic and rubber, provided sufficient friction exists between the nip roller and the separating roller to separate a cover base from a support member.

Figure 5:
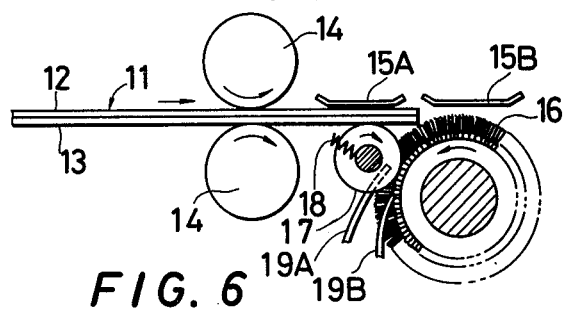
FIG. 5 is a side view of the essential part of a stripping device.

FIG. 5 shows a first embodiment of a device for positively stripping a cover base from a support member. This device is so arranged that a photosensitive material 11 is set, with its support member 12 positioned up and with its cover base 13 positioned down, and shifted along a transporting passage which is constituted by a pair of transporting rollers 14,14 for shifting the photosensitive material 11 in a given direction, and guide plates 15A, 15B. A stripping roller 16 and a nip roller 17 are disposed below guide plates 15B and 15A, respectively.

Figure 6:
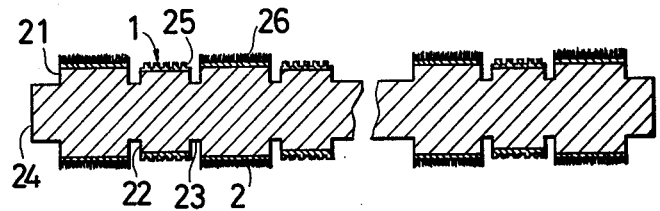
FIG. 6 is a cross sectional view of the stripping roller.

A clearly seen in FIG. 6, stripping roller 16 is constructed by prefabricating an integral core metal roller 24 consisting of diametrically large portions 21, diametrically small portions 22, and grooves or recesses 23, the diametrically large portions alternating with the diametrically small portions and separated by the grooves. Subsequently, a rubber sheet 25 having a number of projections on the surface thereof is attached to the peripheral surfaces of respective diametrically small portions 22 of the roller, thereby providing separating rollers 1, and a tape of cloth 26 embedded with a number of tip-bent plastic filaments is attached to the peripheral surfaces of respective diametrically large portions 21, thereby forming brush rollers 2.

Nip roller 17 consists of a plurality of independent plastic rollers 4 as shown in FIG. 3, each of which is pressed under the force of springs 18 on each separating roller 1, thereby providing a nip pressure therebetween. Provided between independent rollers 17, 17 is a separating rib 19A. Another stripping rib 19B faces respective grooves 23 between respective friction rollers 1 and brush rollers 2 of the stripping roller.

In the device thus constructed, the developing action for stripping the cover base is effected in the manner described below. As illustrated in FIG. 7, when the leading end of photosensitive material 11 being transported comes in to contact with brush rollers 2 of stripping roller 16 which is rotating in the direction opposite the direction of transportation of the photosensitive material, then cover base 13 is stripped at the leading end thereof from support member 12, and the leading end of cover base 13 thus stripped is transported with rotation of brush rollers 2. As soon as the leading end of cover base 13 contacts nip rollers 17, the leading end thereof enters, through the rotation of the nip rollers, between the nip rollers and separating rollers 1 having a frictional characteristic which is similar to the nip rollers and in contact therewith, and cover base 13 is delivered downwards, under the guidance of stripping rib 19B as well as separating rib 19A which are provided at the exit portion between both rollers, without a risk of clinging to stripping roller 16 and to nip rollers 17. Guide plate 15B is adapted to move between two positions in a manner that the guide plate assumes a position shown by the dotted line until the leading end of cover sheet 13 is sandwiched between nip roller 17 and stripping roller 16, and when that leading end is between these rollers, the guide plate is shifted to a position shown by the solid line, so as to protect an image developed on the support member from being spoiled. A pair of delivering rollers 20, 20, therefore, are preferably positioned slightly upwards of the horizontal photosensitive-material-transporting passage.

In this embodiment, in order to protect the developed surface of the support member from being spoiled by the brush rollers, guide plate 15B is arranged as to move upwards so as to change slightly upwards the direction of shift of photosensitive material. As an alternative, the stripping roller may be displaced downwards, with the direction of shift of photosensitive material remaining intact. Alternatively, rather than shifting the guide plate or the stripping roller, and taking in view the fact that a portion of photosensitive material being fed by the pair of transporting rollers 14, 14 is relatively short in length and hence free from being slackened during its travel to the stripping roller, and that portion of the photosensitive material becomes relatively increased in length when passing the stripping roller and is likely to slacken, the pair of delivery rollers 20, 20 may be so arranged as to guide the photosensitive material upwards at a spacing from the stripping roller 16, as shown in FIG. 8.

FIG. 9 is a side view of a device for ensuring the positive ejection of a cover base separated from the support member, according to an embodiment of the invention, and FIG. 10 is a fragmentary plan view of the essential part thereof. A plurality of separating rollers 1 and a plurality of brush rollers 2 larger in diameter than the separating rollers 1 are mounted alternately in side by side relation on a shaft, and these separating rollers and brush rollers are rotated in a direction opposite to the direction of travel of a photosensitive material shown by an arrow A, so that a cover base may be stripped at the leading end from the support member by brush rollers 2. The cover base thus separated is pulled downwards by separating rollers 1 and nip rollers 17 in pressure contact therewith. Because of the brush rollers being larger in diameter than the separating rollers, the cover base tends to curve to the left with the result that there is a likelihood of the cover base clinging to the peripheral surfaces of nip rollers 17. This is avoided by the following arrangement. Back-up rollers 30 rotating in contact with nip rollers 17 are fixedly mounted on a shaft 32, and guide rollers 31 are journaled with ball bearings in a manner to alternate with the back-up rollers 30. All of the back-up rollers 30 thus are rotated at the same speed by nip rollers 17, and guide rollers 31 contacting brush rollers 2 respectively are rotated in a direction reverse to the direction of rotation of back-up rollers 30, namely in a direction of the outgoing cover base. Thus, the cover base is drawn in a direction of arrow C by the combination of brush rollers 2 and guide rollers 31, without clinging to the peripheral surfaces of nip rollers 17. A guide bar 33 is provided for preventing the clinging of the cover base to brush rollers 2, and a guide bar 34 is for preventing the clinging of the cover base to guide rollers 31, these guide bars being in the form of a comb. Nip rollers 17 are placed between separating rollers 1 and back-up rollers 30, and pressed, through the photosensitive material being transported, by a press roller 35, to thereby provide a nip pressure between these rollers. In order to prevent the displacement of a photosensitive material from a given position which might arise when the rotating brush rollers 2 contact the photosensitive material, there is provided a back-up plate 36, which is adapted to move to an upper retracted position after completion of the stripping of the leading end of the cover base by brush rollers 2.

The device according to the present invention enables the positive separation of a cover base from a support member by a mechanism simple in construction, dispensing with extra materials, such as an adhesive tape, or a strong suction device, as well as prevents the clinging of a separated cover base to the back-up rollers, which has been a problem incidental to the provision of the back-up rollers for positively delivering the separated cover base in prior art devices.

What is claimed is:

1. In a device for developing a photosensitive material by stripping a cover base from the photosensitive material consisting of the cover base laminated through the intermediary of a photosensitive layer to a support member, said stripping and developing device comprising:

a stripping roller consisting of the combination of a plurality of cover-base separating rollers and a plurality of brush rollers larger in diameter than said separating rollers, said separating rollers and said brush rollers being arranged alternately in side by side relation; and a plurality of nip rollers contacting said separating rollers, said stripping roller being rotated in a direction opposite to the direction of transportation of the photosensitive material, with said brush rollers contacting the cover base surface of the photosensitive material, said brush rollers stripping the cover base at the leading end of the photosensitive material from said support member, and the cover base thus separated being held for transportation between said separating rollers and said nip rollers, whereby the cover base is completely separated from the support member.

2. A stripping and developing device as defined in claim 1, wherein said nip rollers are independently mounted for constant rotation with respective ones of said separating rollers.

3. A stripping and developing device as defined in claim 1, wherein said nip rollers are arranged in side by side relation on a common shaft for contact with respective ones of said separating rollers.

4. A stripping and developing device as defined in claim 1, further comprising:

back-up rollers rotating in contact with said nip rollers; and guide rollers rotating in a direction of delivery of the cover base is opposing relation to said brush rollers, said back-up rollers and said guide rollers being arranged alternately in side by side relation, and said back-up rollers and said guide rollers being rotatable independently of one another.

5. A stripping and developing device as defined in claim 4, further comprising press rollers which press said nip rollers, through the photosensitive material being transported, to provide nip pressure between said nip rollers and said back-up rollers.

* * * * *